(12) United States Patent
Abe et al.

(10) Patent No.: US 7,764,558 B2
(45) Date of Patent: Jul. 27, 2010

(54) HYBRID SENSE AMPLIFIER AND METHOD, AND MEMORY DEVICE USING SAME

(75) Inventors: Keiichiro Abe, Ibaraki (JP); Yukata Ito, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 186 days.

(21) Appl. No.: 12/115,687

(22) Filed: May 6, 2008

(65) Prior Publication Data

US 2009/0279371 A1 Nov. 12, 2009

(51) Int. Cl.
*G11C 7/02* (2006.01)
(52) U.S. Cl. ...................... 365/207; 365/205
(58) Field of Classification Search .................. 365/207, 365/205, 203
See application file for complete search history.

(56) References Cited

U.S. PATENT DOCUMENTS 6,157,219 A * 12/2000 Okada .................... 327/55
7,405,987 B1 * 7/2008 Moscaluk ................ 365/207

* cited by examiner

*Primary Examiner*—Anh Phung
(74) *Attorney, Agent, or Firm*—Dorsey & Whitney LLP

(57) ABSTRACT

Sense circuits, devices and methods are disclosed, including a sense amplifier circuit that has first and second complementary data lines and a sensing circuit. One of the data lines can be coupled to a memory cell for data sensing and the other data line can be used as reference. The sensing circuit has first and second complementary output nodes and is coupled to the data lines. In a first mode, the sensing circuit can sense a difference between a voltage on the first digit line and a voltage on the second digit line to generate a first voltage differential between the first and second output nodes. In a second mode, the sensing circuit can sense a difference between a current flow in the first digit line and a current flow in the second digit line to generate a second voltage differential between the first and second output nodes. Other sense circuits, devices and methods are also provided.

20 Claims, 7 Drawing Sheets

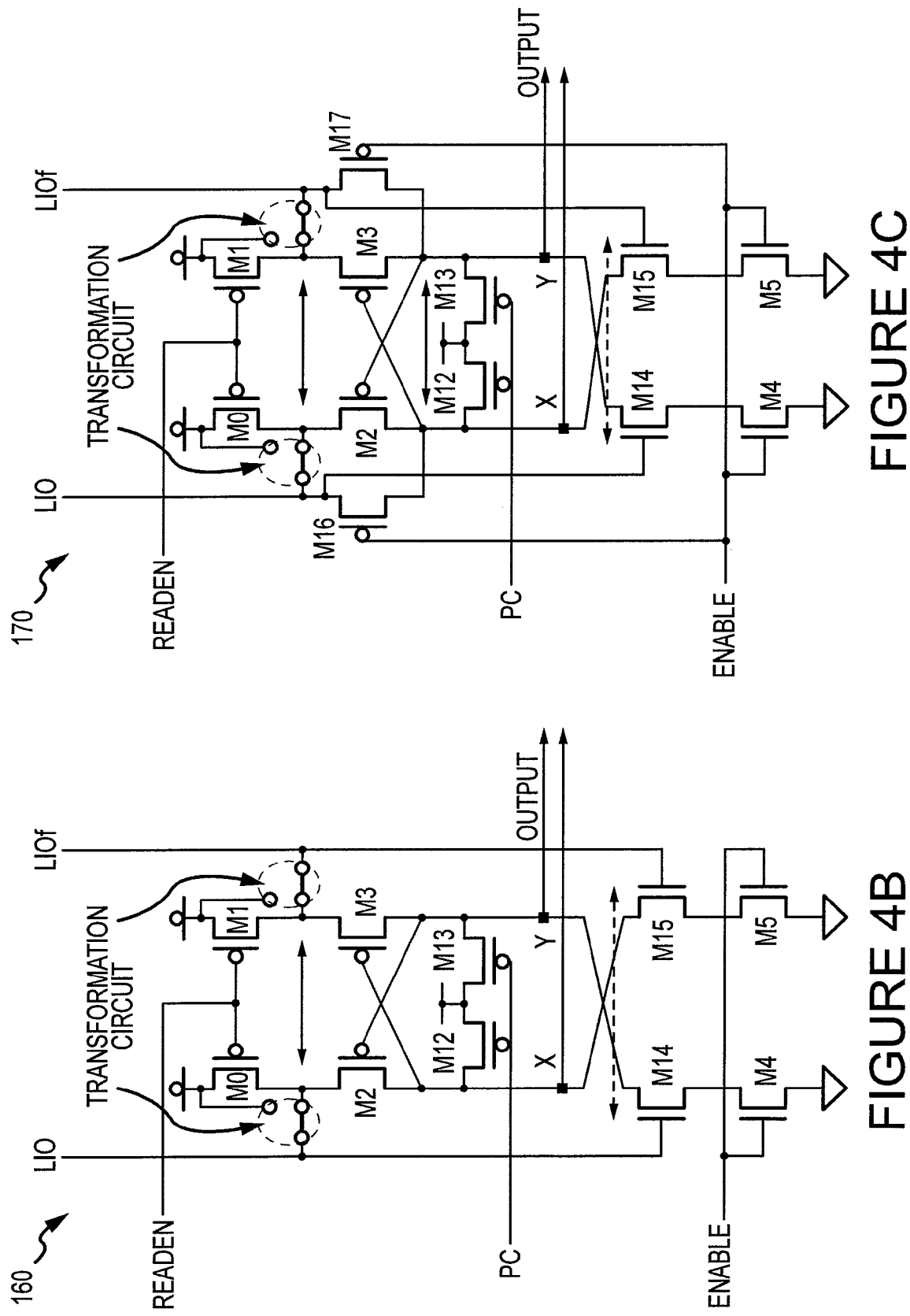

HYBRID SENSE AMPLIFIER AND METHOD, AND MEMORY DEVICE USING SAME

TECHNICAL FIELD

Embodiments of this invention generally relate to integrated circuit memory devices, and more particularly, in one or more embodiments, to a hybrid style sense amplifier in a memory device.

BACKGROUND OF THE INVENTION

Memory devices, such as static random access memory ("SRAM") and dynamic random access memory ("DRAM"), typically include arrays of memory cells for storing a digit of data in each of the memory cells. Depending on the charge, or voltage level, stored within a memory cell, the respective data digit may represent a logical low (e.g., a binary "0") or a logical high (e.g., a binary "1"). For instance, a voltage level close to ground may represent a logical low or "0" and a voltage level close to a supply voltage for the memory device may represent a logical high or "1."

Data digits stored in the memory cells are sensed through electrical paths. The electrical paths that carry the voltage representing a data digit so that the data may be sensed can be referred to as data lines, and are generally known in the industry as "digit" or "bit" lines, where those terms are used interchangeably. Digit lines may be precharged before the data stored in associated memory cells is sensed, because precharging the digit lines may allow faster sensing of the data stored in the memory cells. When a digit line, such as a bit line is precharged, the voltage level on the bit line is equalized to a voltage that is typically between the voltage levels corresponding to logical low and logical high. Accordingly, when the voltage level on a bit line begins to change to a new level due to charge sharing as a memory cell is accessed via the bit line, the range of voltage transition from the precharged level to the new level will typically be smaller than if the bit line was not precharged.

Sense amplifiers are typically used in memory devices for sensing and amplifying electrical signal representing data digits stored in memory cells. More specifically, bit lines are coupled to sense amplifiers so that electrical signals representing data bits stored in accessed memory cells (e.g., voltage levels or current flows) are coupled to sense amplifiers for sensing and amplification. A sense amplifier that senses a difference in current between the current flows on a complementary pair of bit lines coupled to the sense amplifier is generally known as a current sense amplifier. Likewise, a sense amplifier that senses a difference in voltage between the voltage levels on a complementary pair of bit lines coupled to the sense amplifier is generally known as a voltage sense amplifier. Whatever the case may be, in a sense amplifier the complementary pair of bit lines is precharged to the same voltage level prior to sensing and amplifying the electrical signal representing the data bit.

As the popularity of portable electronic devices continues to increase, demands for low-power, high-speed, and low-cost memory devices are consequently on the rise. With the low power requirement, the need for sense amplifiers to detect small voltage or current differential between the bit lines, which is often referred to as "bit line split", becomes ever more important. One conventional approach is to employ short bit lines in the memory array architecture, thereby reducing parasitic capacitance in the bit lines in order to improve the minimum detectable bit line split. However, such approach carries with it the undesirable effect of larger overhead in terms of chip size. Moreover, as chip size continues to decrease, device variations such as mismatches in transistor characteristics and offsets in sense amplifiers generally makes it even more difficult to detect small bit line split in a low power setting.

Between current sense amplifiers and voltage sense amplifiers, current sense amplifiers generally provide better imbalance immunity, and therefore, tend to be able to detect smaller bit line split than voltage sense amplifiers. Current sense amplifiers also have higher sensing speed than voltage sense amplifiers in general. However, current sense amplifiers typically consume more power than voltage sense amplifiers do given that current sense amplifiers tend to waste some of the direct current during activation.

There is, therefore, a need for current sense amplifiers that can provide a balance in performance in terms of detection capability, sensing speed, and power consumption.

BRIEF DESCRIPTION OF THE DRAWINGS

FIGS. 4A-4C are each a schematic diagram of a sense amplifier in accordance with an alternative embodiment of the invention.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1:
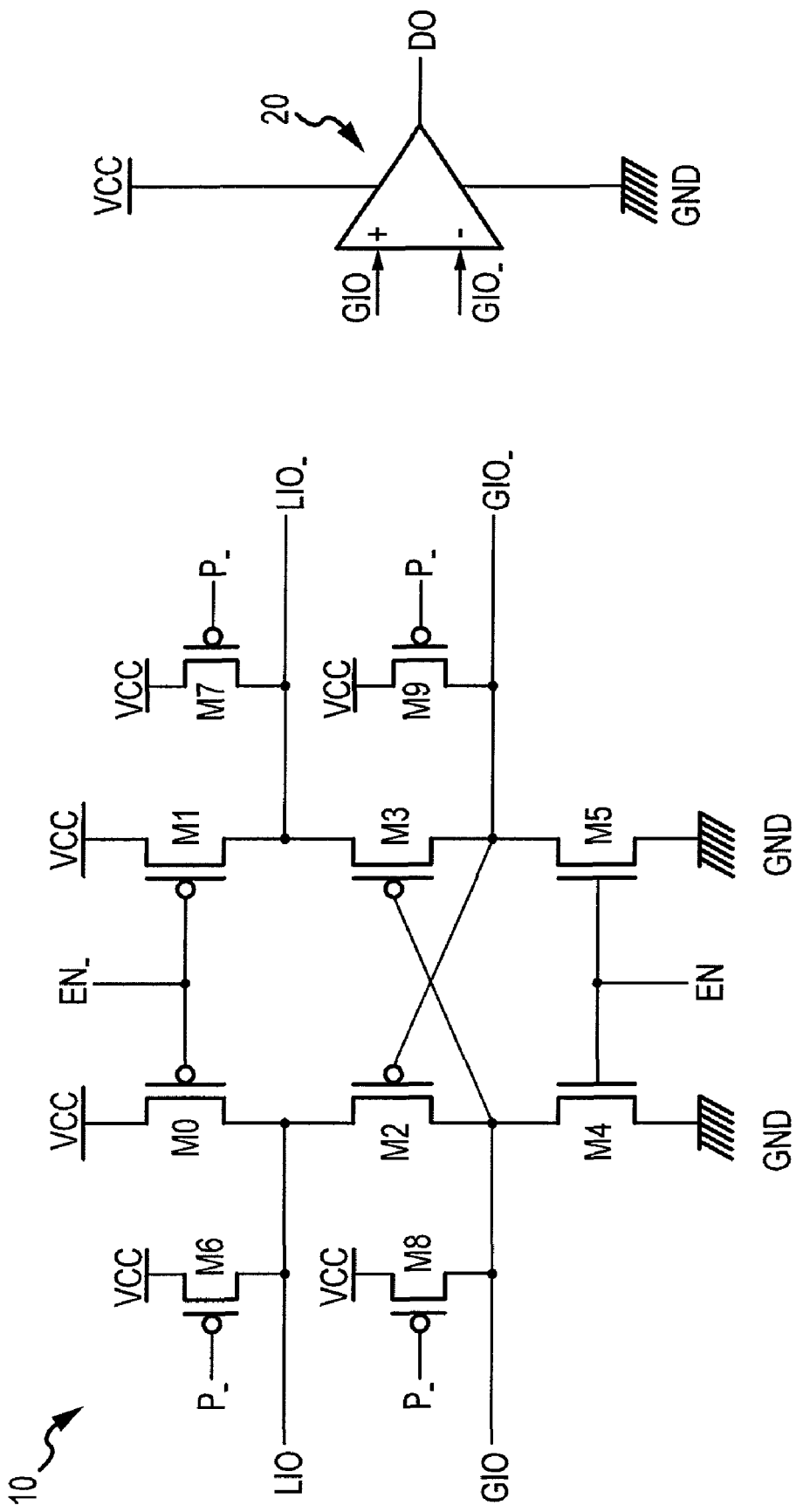
FIG. 1 is a schematic diagram of a conventional sense amplifier.

FIG. 1 illustrates a schematic diagram of a conventional sense amplifier 10 that may be used in a memory device. More specifically, the sense amplifier 10 may be used to sense data stored in the memory cells and to write data into the memory cells. The sense amplifier 10 primarily includes a first pair of p-channel metal-oxide semiconductor (PMOS) transistors M0 and M1, a second pair of PMOS transistors M2 and M3, and a pair of n-channel metal-oxide semiconductor (NMOS) transistors M4 and M5. As used herein, the term MOS also refers to poly over oxides. The transistors M0, M1, M2, M3, M4 and M5 are coupled to each other in the manner shown in FIG. 1. More specifically, transistors M0, M2 and M4 are arranged in series with the source of M0 coupled to a relatively high voltage, such as VCC, and the source of M4 coupled to a relatively low voltage, such as ground. Likewise, transistors M1, M3 and M5 are arranged in series with the source of M1 coupled to the same relatively high voltage, such as VCC, and the source of M5 coupled to the relatively low voltage, such as ground. The relatively high voltage VCC may be, for example, one half the voltage level of the power supply voltage of the memory device having the sense amplifier 10, but may be some other voltage level depending on the application. The gate of M2 is cross coupled to the drain of M3 while the gate of M3 is cross coupled to the drain of M2. The gates of M0 and M1 are coupled to receive signal EN_. The gates of M4 and M5 are coupled to receive signal EN.

As a current sense amplifier, sense amplifier 10 senses a difference in current flows on a pair of data lines, shown as local input/output (LIO) lines LIO and LIO_. The LIO and LIO_ lines are each coupled to a node between the drain of transistor M0 and the source of transistor M2 and a node between the drain of transistor M1 and the source of transistor M3, respectively. A pair of data lines, shown as global input/output (GIO) lines GIO and GIO_, are coupled to a node between the drain of transistors M2 and M4 and a node between the drain of transistors M3 and M5, as shown in FIG. 1. Each of the data lines LIO, LIO_ and the data lines GIO, GIO_ has a respective reset switch used to reset the voltage on the respective line to an equilibrating voltage level. More specifically, a PMOS transistor M6 is coupled between the voltage source VCC and line LIO, a PMOS transistor M7 is coupled between VCC and line LIO_, a PMOS transistor M8 is coupled between VCC and line GIO, and a PMOS transistor M9 is coupled between VCC and line GIO_. The gate of each of the transistors M6, M7, M8 and M9 is coupled to receive the signal P_.

In operation, sense amplifier 10 typically goes through a precharge stage, a pre-sensing stage and a sensing stage. During the precharge stage, the signal EN is at a low state (e.g., at a low voltage level such as ground) while the signal EN_ is at a high state (e.g., at a high voltage level such as VCC). As a result, transistors M0, M1, M4 and M5 are not enabled, in other words are not activated, to allow current to flow through. In addition, during the precharge stage, the signal P_ is at a low state (e.g., at a low voltage level such as ground) to activate transistors M6, M7, M8 and M9. With transistors M6, M7, M8 and M9 activated, lines LIO, LIO_ and lines GIO, GIO_ are coupled to the voltage VCC, and the voltage level on each of lines LIO, LIO_ and lines GIO, GIO_ is set to VCC.

During the pre-sensing stage, the signal P_ is set to a high state (e.g., at a high voltage level such as VCC) to isolate lines LIO, LIO_ and lines GIO, GIO_ from voltage source VCC by deactivating transistors M6, M7, M8 and M9. Afterwards, one of the lines LIO, LIO_ is coupled to a memory cell of the memory device to sense the memory cell. For example, line LIO may be used to sense a memory cell to read the data bit stored in that memory cell. As previously described, the voltage level on the line LIO in this example will change to a new level due to charge sharing. At this point, signal EN goes high while signal EN_ goes low, thereby activating transistors M0, M1, M4 and M5 to begin the sensing stage for current sensing.

Figure 2:
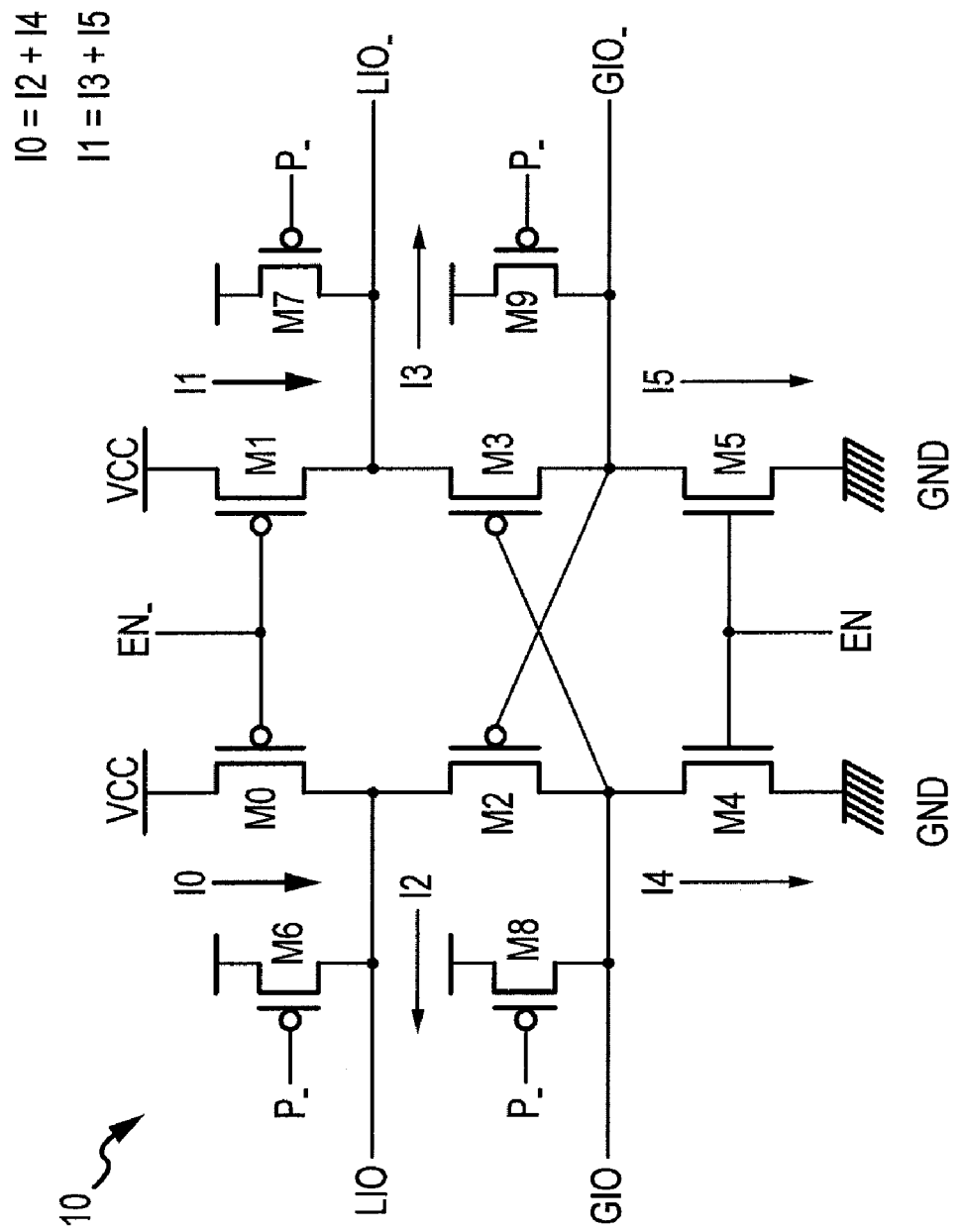
FIG. 2 is a schematic diagram showing current flows during current sensing by the conventional current sense amplifier of FIG. 1.

FIG. 2 illustrates a schematic diagram showing current flows during current sensing by the sense amplifier 10 of FIG. 1. When transistors M0, M1, M4 and M5 are activated by setting EN signal to a high state and EN_ signal to a low state, each of transistors M0, M1, M4 and M5 begins to allow electric current to flow through. The relationship between the currents flowing through the components of sense amplifier 10 can be expressed by the following formulae: I0=I2+I4 and I1=I3+I5.

As known in the art, with one of the lines LIO, LIO_ sensing a memory cell while the other is serving as the reference line, the current flowing in LIO typically will not be the same as the current flowing in LIO_. Following the previous example in which line LIO is used to sense a memory cell and bit line LIO_ is used as the reference line, the current flowing in LIO, I2, may be larger than the current flowing in LIO_, I3. Assuming no or minimal mismatch between transistors M0 and M1, the current flowing through transistor M0, I0, will be approximately equal to the current flowing through transistor M1, I1. In other words, with I2 larger than I3 and I0 approximately equal to I1, the current flowing through transistor M4, I4, is smaller than the current flowing through transistor M5, I5.

The NMOS transistors M4 and M5 operate in the saturation mode when their gates are coupled to a high voltage such as VCC. As such, transistors M4 and M5 each behaves like a resistive element in that the voltage level at the drain is linearly proportional to the current flowing through the transistor itself. Accordingly, because current I4 is relatively small due to a relatively large I2 and current I5 is relatively large due to a relatively small I3, the voltage at the drain of transistor M4 is relatively lower than the voltage at the drain of transistor M5. Because the voltage at the drain of transistors M4 and M5 drive transistors M2 and M3, respectively, the difference between the voltage levels at the drain of transistors M4 and M5 eventually result in transistor M2 being throttled shut (i.e., being disabled) and transistor M3 being throttled open (i.e., being enabled). Eventually, the voltage at the drain of transistor M4, which is also the voltage on line GIO, is driven to ground whereas the voltage at the drain of transistor M5, which is also the voltage on line GIO_, is driven to VCC. The lines GIO, GIO_ are further coupled to a differential amplifier 20, as part of data input/output (I/O) circuitry such as a column circuitry, that outputs a voltage the value (e.g., level) of which depends on the voltage differential between the lines GIO, GIO_, which in turn is indicative of the value of the data digit stored in the sensed memory cell.

Ideally, if all device characteristics are the same as the design specifications, current sensing by sense amplifier 10 would occur in the manner just described without deviation. Realistically, however, imbalance between the devices (e.g., the transistors shown in FIGS. 1 and 2) does exist. For instance, it is possible that there is a significant imbalance between the transistors M4 and M5. More specifically, for example, the imbalance might be the threshold voltage of transistor M4 being higher than the threshold voltage of transistor M5. This undesirable situation could yield misreading of the data bit of the sensed memory cell as a result of erroneous sensing due to the mismatch.

Figure 3:
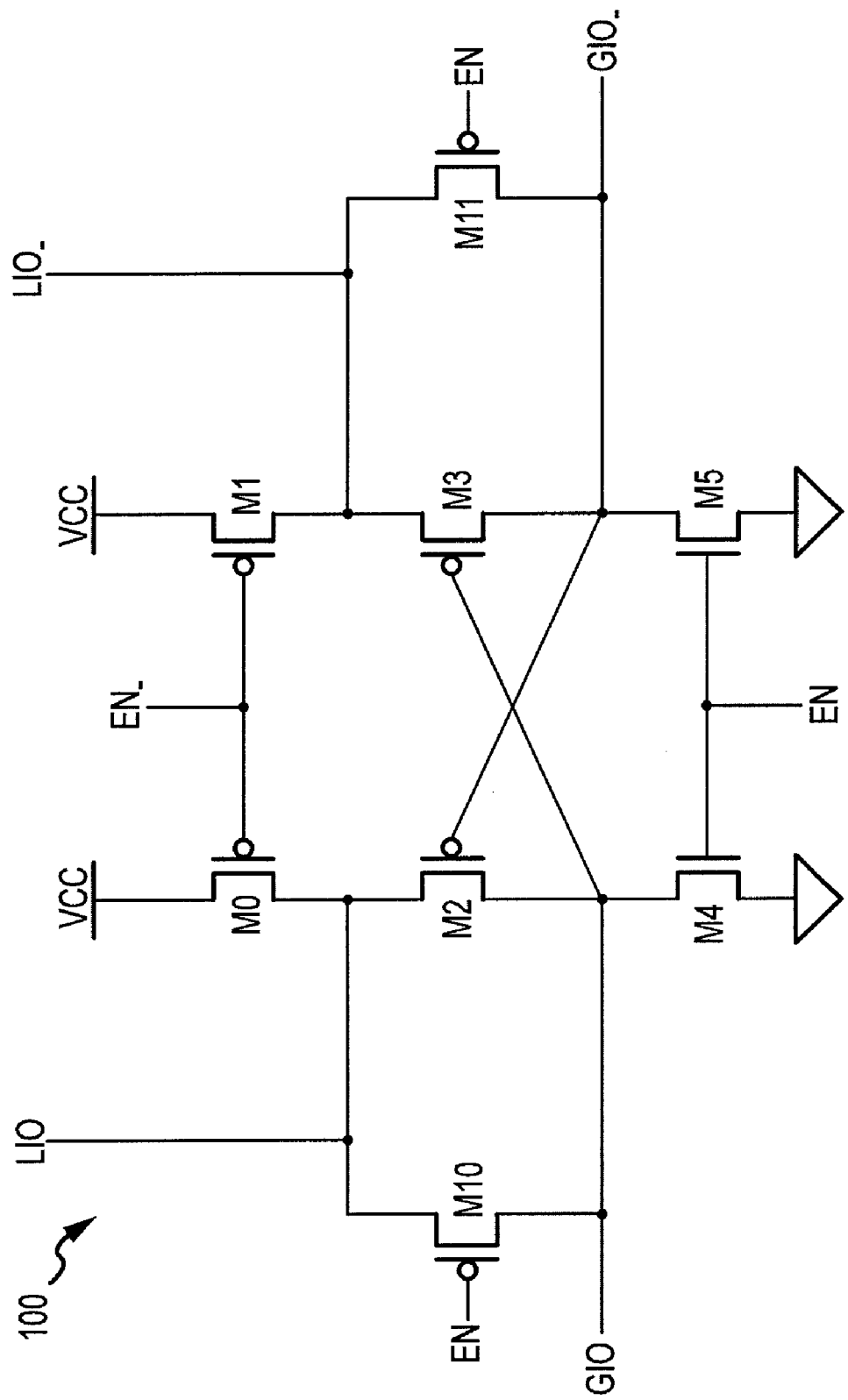
FIG. 3 is a schematic diagram of a sense amplifier in accordance with an embodiment of the invention.

FIG. 3 illustrates a schematic diagram of a sense amplifier 100 in accordance with an embodiment of the invention. The sense amplifier 100 is a current sense amplifier and similar to the sense amplifier 10 of FIGS. 1 and 2, although transistors M6, M7, M8 and M9 are not shown in FIG. 3 and FIGS. 4A-4C so as not to obscure the diagrams. Therefore, a description of the components of the sense amplifier 100 that are also in the sense amplifier 10 will not be provided in the interest of brevity. Compared to sense amplifier 10, the sense amplifier 100 has the additional transistors M10 and M11. Although transistors M10 and M11 are shown as PMOS transistors in FIG. 3, in other embodiments of the invention transistors M10 and M11 may be NMOS transistors or other form of a switch. The transistors M10 and M11 couple line LIO to line GIO and line LIO_ to line GIO_, respectively, when activated by the signal EN set at a low state.

During the pre-sensing stage, when line LIO is coupled to the memory cell to be sensed the voltage on line LIO and the voltage on line GIO are equalized at a new level due to charge sharing with the sensed memory cell and the signal EN being low. Similarly, the voltage on line LIO_ and the voltage on line GIO_ are equalized since the transistor M11 is enabled due to the signal EN being low during the pre-sensing stage. This way, although the bit line split in the current sense amplifier 100 is detected when transistors M0 and M1 are activated, the bit line split is injected to the lines as voltage gain even before the current sensing action begins. The voltage level on line LIO is applied to the line GIO, as well as the node that is connected to the gate of transistor M3 and the drain of transistor M4, before activation of the sense stage. Thus, the voltage on this node that is critical to both current sensing and voltage sensing is set to the voltage on the line LIO, which is indicative of the bit line split due to charge sharing with the sensed memory cell. As a result, a mixture of voltage sensing and current sensing is enabled in sense amplifier 100. This, in turn, helps improve imbalance immunity to overcome the issue of device imbalance as previously described, and thereby helps allow sense amplifier 100 to detect small bit line split.

Figure 4A:
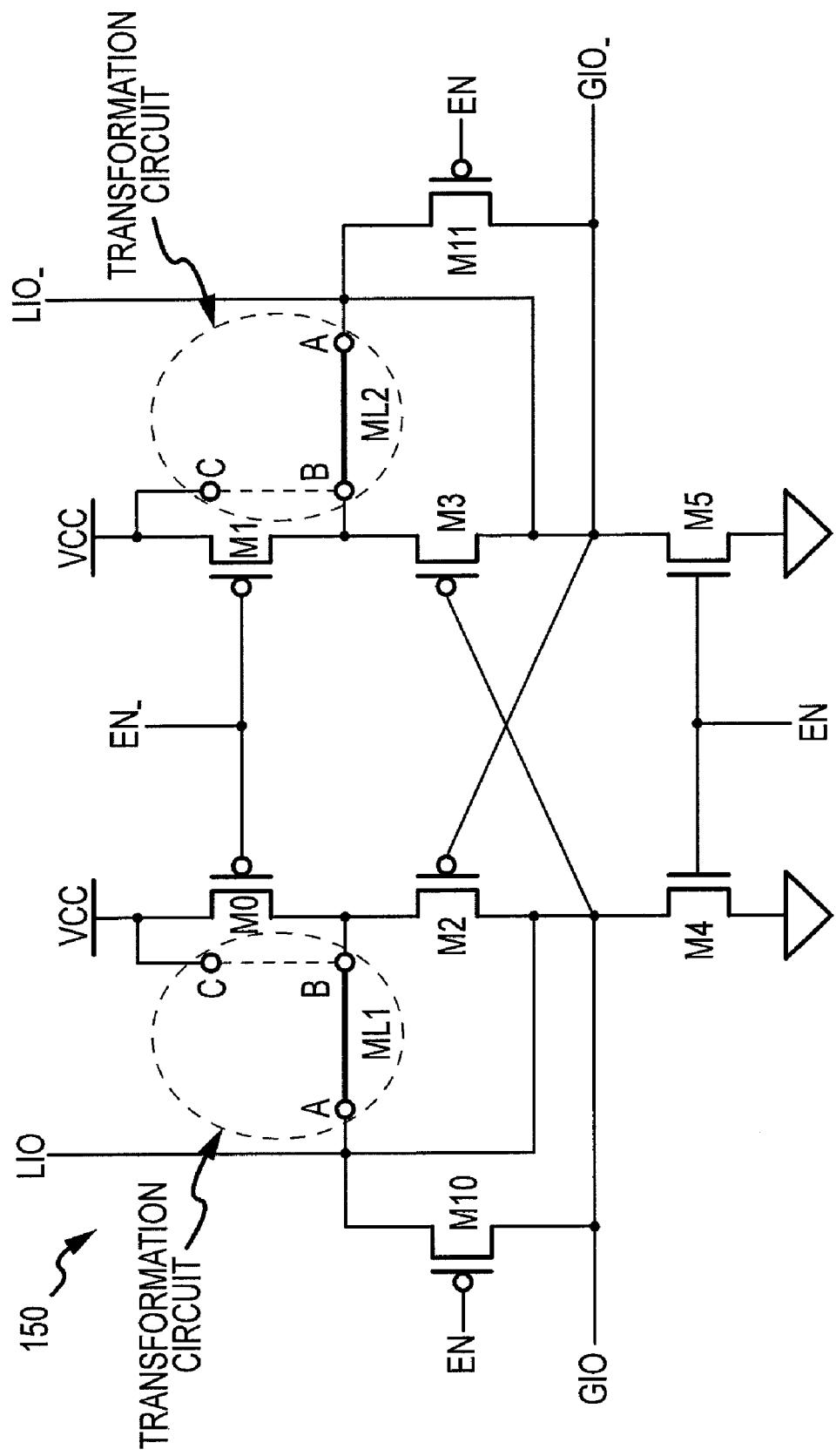

FIG. 4A illustrates a schematic diagram of a sense amplifier 150 in accordance with another embodiment of the invention. The sense amplifier 150 is similar to the sense amplifier 100 of FIG. 3 in that both are hybrid-style sense amplifiers capable of current sensing and voltage sensing. The difference, however, is that sense amplifier 150, having the components and structure to function as a current sense amplifier, may be configured to function as a voltage sense amplifier.

In the embodiment shown in FIG. 4A, three-point switches with metal option, such as metal lines ML1 and ML2, may be used to connect the respective points A and B or points B and C. More specifically, when each of metal lines ML1 and ML2 is laid out to connect respective points A and B (as represented by the solid line between A and B), each of lines LIO and LIO_ is coupled to the node between transistors M0 and M2 and the node between transistors M1 and M3, respectively. In this configuration, sense amplifier 150 will function as a current sense amplifier as described above with respect to sense amplifier 100. On the other hand, when each of metal lines ML1 and ML2 connects respective points B and C (as represented by the dotted line between B and C), each of transistors M0 and M1 is shorted out (the voltage source VCC is directly coupled to the source of transistors M2 and M3), and each of lines LIO and LIO_ is coupled to the node between transistors M2 and M4 and the node between transistors M3 and M5, respectively. The sense amplifier 150 will function as a voltage sense amplifier in such a configuration.

Transforming the configuration to switch from current sensing to voltage sensing without the need to alter the layout of sense amplifier 150 provides the advantage of flexibility. In the embodiment shown in FIG. 4, change of the layout of metal lines ML1 and ML2 may be effected with mask change for the metal layer during fabrication process. Alternatively, the layout change may be implemented in the poly layer. In other embodiments, programmable links such as fuses, antifuses, transistors and the like may be used in place of the metal lines ML1 and ML2.

In an alternative embodiment, the metal lines ML1 and ML2 in the transformation circuit, comprised of two three-way switches, of sense amplifier 150 may be substituted with other programmable links (not shown), such as transistors, that may be activated by a signal to perform the function of the metal lines ML1 and ML2. For example, the gates of the transistors used in the three-way switches may be coupled to receive a mode entry signal indicative of entry of a test mode. The mode entry signal may be at a first state (e.g., low) when the memory device having sense amplifier 150 is in normal operating mode. With the mode entry signal at the first state, the three-way switches are not activated and sense amplifier 150 is configured as a current sense amplifier. When the memory device enters a test mode, however, the mode entry signal changes from the first state to a second state (e.g., high) thereby activating the three-way switches. With the three-way switches activated, sense amplifier 150 is transformed into a voltage sense amplifier due to transformation in its configuration. When the mode entry signal returns to the first state (e.g., when the memory device returns to normal operating mode), the three-way switches are deactivated and thereby transform the sense amplifier 150 back into a current sense amplifier. In other embodiments the three-way switches may be activated upon entry of a different mode, not necessarily a test mode, or upon the occurrence of certain conditions. The ability to alter the function of a sense amplifier between current sensing and voltage sensing in a post-production memory device provides flexibility at least in the context of testing, as will be appreciated by those ordinarily skilled in the art.

FIGS. 4B-4C are each a schematic diagram of a sense amplifier in accordance with an alternative embodiment of the invention. Like the sense amplifier 150 shown in FIG. 4A, each of the sense amplifiers 160 and 170 shown in FIGS. 4B and 4C, respectively, can be similarly transformed into a voltage sense amplifier that outputs a signal as a result of voltage sensing. In the interest of brevity, description of the ways to transform the sense amplifiers 160, 170 will not be repeated.

Each of the sense amplifiers 160, 170 is configured differently from the sense amplifier 150. In sense amplifier 160, the lines LIO, LIOf are each coupled directly to the gate of transistors M14 and M15, respectively. In operation, a signal pc activates transistors M12, M13 to precharge the output nodes X and Y that are between transistors M2 and M14 and between transistors M3 and M15, respectively. The voltage on each of the lines LIO, LIOf is also reset to an equilibrating voltage level. Next, line LIO is coupled to a memory cell to sense the data in the memory cell while the complementary line LIOf is not coupled to a memory cell so it can serve as a reference. As explained previously, the voltage level on the line LIO will change due to it being coupled to the respective memory cell. As a result, there will be a voltage differential between the voltage on line LIO and the voltage on line LIOf. Because lines LIO and LIOf are directly coupled to the gates of transistors M14 and M15, respectively, transistors M14 and M15 will each be biased to a different extent. Consequently, a voltage differential between output nodes X and Y will develop when transistors M4 and M5 are activated as the signal enable goes high. When transistors M0 and M1 are activated by an enabling signal, such as the signal readen, current sensing by sense amplifier 160 begins. Such a configuration provides greater voltage gain and thereby allows sense amplifier 160 to detect small bit line split that might not be detected by a conventional sense amplifier such as sense amplifier 10.

The sense amplifier 170 shown in FIG. 4C is a variation of sense amplifier 160 of FIG. 4B. In addition to being coupled to the gates of transistors M14 and M15, respectively, the lines LIO and LIOf are also coupled to the drains of transistors M12 and M13, respectively, when the signal enable is at a low state. As a result, any voltage differential between the lines LIO and LIOf will be imparted unto the output nodes X and Y because of the direct coupling of LIO and LIOf to the output nodes X and Y and because transistor M14 is biased by the voltage on line LIO and M15 is biased by the voltage on line LIOf. This allows sense amplifier 170 to detect small bit line split that might not be detected by a conventional sense amplifier such as sense amplifier 10. Thus, as will be appreciated by those ordinarily skilled in the art, embodiments of the invention such as sense amplifiers 160, 170 provide enhanced capability to detect small bit line split in addition to the benefits of improved imbalance immunity and sensing speed.

Figure 5:
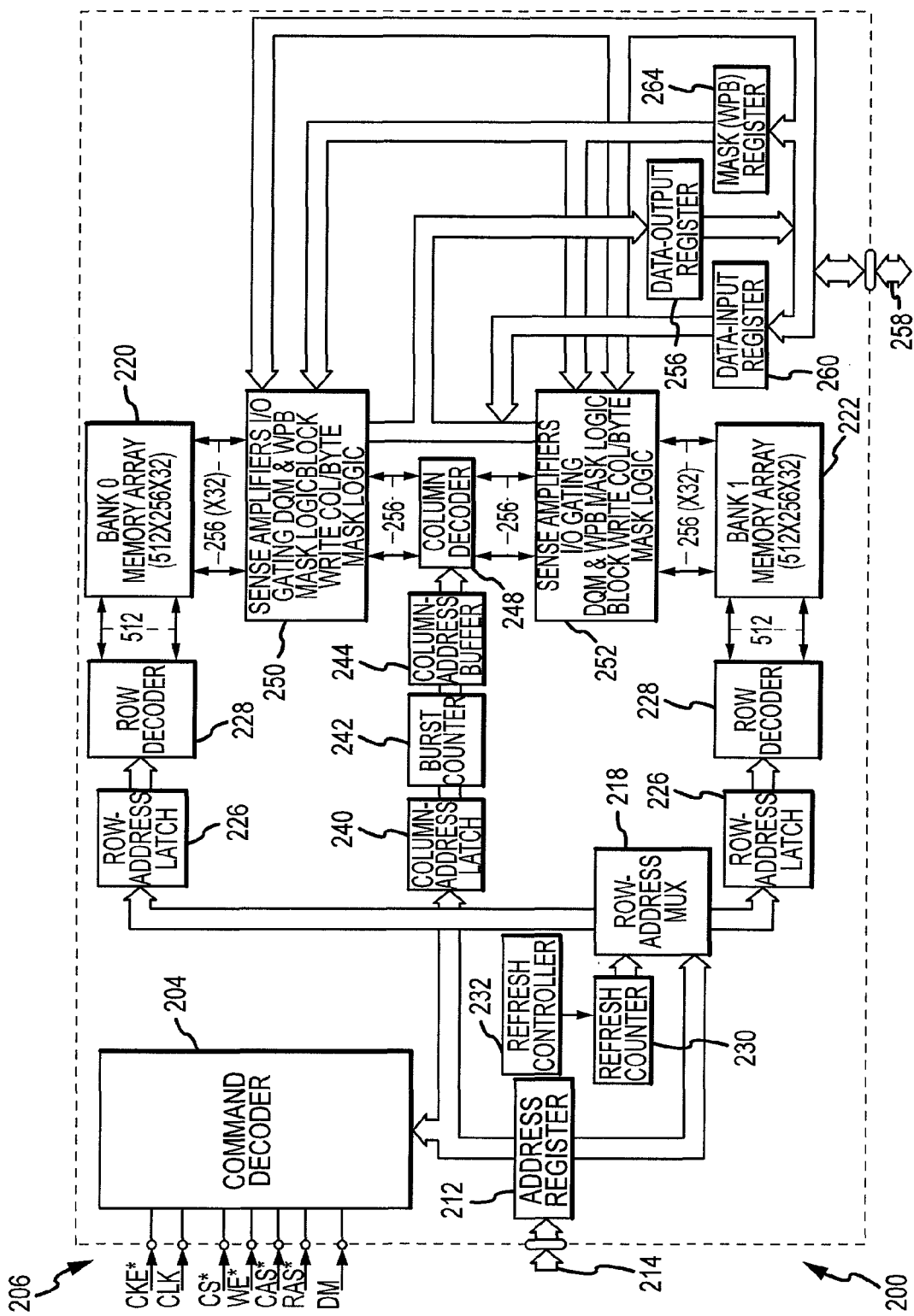
FIG. 5 is a block diagram of a memory device using the current sense amplifier in accordance with an embodiment of the invention.

FIG. 5 is a block diagram of a synchronous dynamic random access memory ("SDRAM") 200 that utilizes the sense amplifier 100 or some other embodiment of the invention. Of course, the sense amplifier 100 and other embodiments of the invention can also be used in other DRAM devices and other memory devices, such as SRAM devices, FLASH memory devices, etc.

The operation of the SDRAM 200 is controlled by a command decoder 204 responsive to high-level command signals received on a control bus 206. These high level command signals, which are typically generated by a memory controller (not shown in FIG. 5), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 204 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 200 includes an address register 212 that receives row addresses and column addresses through an address bus 214. The address bus 214 is generally coupled to a memory controller (not shown in FIG. 5). A row address is generally first received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which decodes the row address and applies corresponding signals to one of the arrays 220 or 222. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232. The refresh controller 232 is, in turn, controlled by the command decoder 204.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242, which applies a sequence of column addresses to the column address buffer 244 starting at the column address output by the address register 212. In either case, the column address buffer 244 applies a column address to a column decoder 248.

Data to be read from one of the arrays 220, 222 is coupled to column circuitry 250, 252 (e.g., sense amplifiers, I/O gating, DQM & WPB mask logic, block write col./byte mask logic) for one of the arrays 220, 222, respectively. The column circuitry 250, 252 may include for each column of memory cells in the arrays 220, 222 the sense amplifier 100, sense amplifier 150, or a sense amplifier according to some other embodiment of the invention. The data bits sensed by the sense amplifier 100 or sense amplifier 150 are then coupled to a data output register 256. Data to be written to one of the arrays 220, 222 are coupled from the data bus 258 through a data input register 260. The write data are coupled to the column circuitry 250, 252 where they are transferred to one of the arrays 220, 222, respectively. A mask register 264 responds to a data mask DM signal to selectively alter the flow of data into and out of the column circuitry 250, 252, such as by selectively masking data to be read from the arrays 220, 222.

Figure 6:
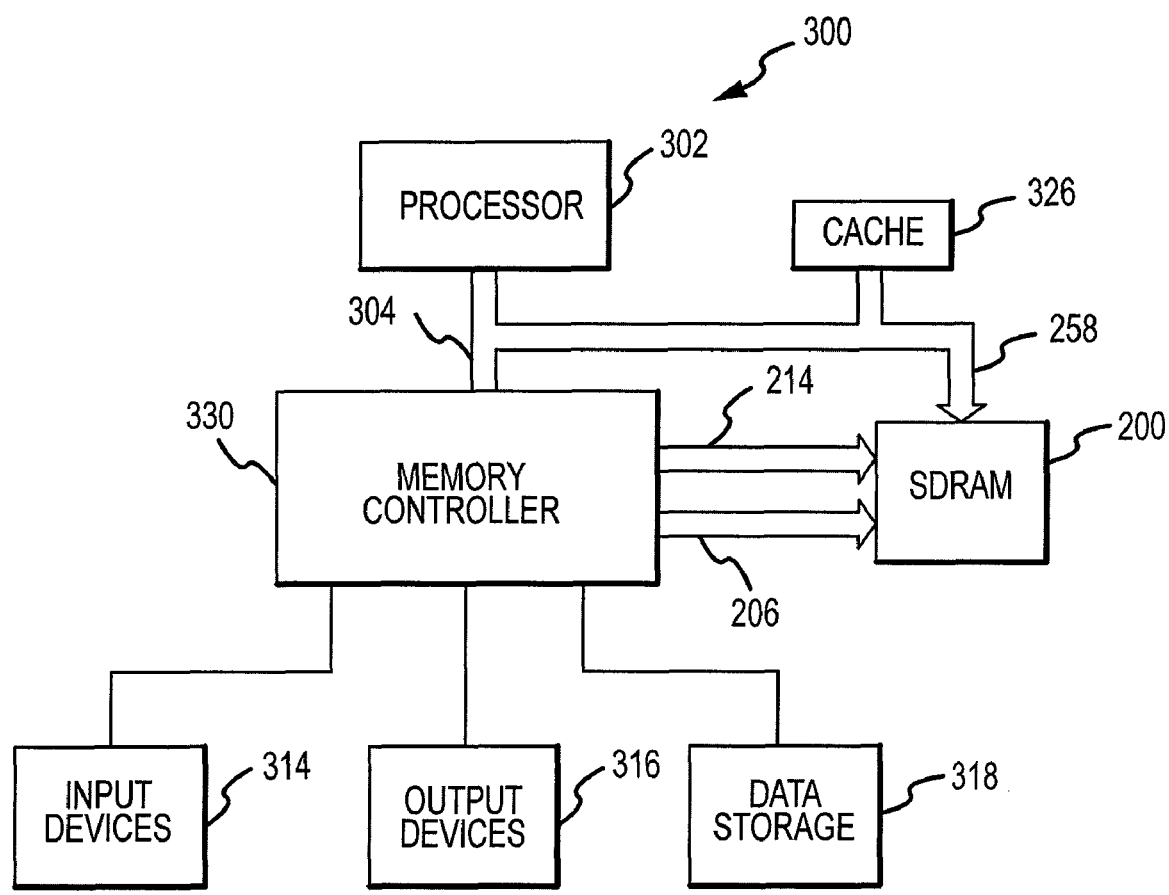
FIG. 6 is a block diagram of an electronic device using the memory device of FIG. 5.

FIG. 6 shows a block diagram of an electronic device 300 that may use the SDRAM 200 or some other memory device that utilizes the sense amplifier 100, sense amplifier 150, or a sense amplifier according to some other embodiment of the invention. The computer system 300 includes a processor 302 (such as one referring to processor cores, distributed processors, ASICs, CPUs, processing circuitry, processing logic, etc.) for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to store data or retrieve data from external storage media (not shown). Examples of typical storage devices 318 include hard and floppy disks, tape cassettes, and compact disk read-only memories (CD-ROMs). The processor 302 is also typically coupled to a cache memory 326, which is usually static random access memory ("SRAM") and to the SDRAM 200 through a memory controller 330. The memory controller 330 includes an address bus 214 (FIG. 5) to couple row addresses and column addresses to the SDRAM 200. The memory controller 330 also includes a control bus that couples command signals to a control bus 206 of the SDRAM 200. The external data bus 258 of the SDRAM 200 is coupled to the data bus of the processor 302, either directly or through the memory controller 330.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A sense circuit, comprising:
   first and second complementary data lines one of which configured to be coupled to a memory cell for data sensing and the other configured to be used as reference; and
   a sensing circuit having first and second complementary output nodes and coupled to the first and second data lines, the sensing circuit configured to:
      sense a difference between a voltage on the first data line and a voltage on the second data line to generate a first voltage differential between the first and second output nodes in a first mode and/or in response to a first condition, and
      sense a difference between a current flow in the first data line and a current flow in the second data line to generate a second voltage differential between the first and second output nodes in a second mode and/or in response to a second condition.

2. The sense circuit of claim 1 wherein the output nodes are coupled to a differential amplifier, and wherein the differential amplifier provides an output signal indicative of a voltage differential between the output nodes.

3. The sense circuit of claim 1 wherein the sensing circuit comprises:
   first and second first-type transistors each having a channel of a first conductivity type and having a source coupled to a first voltage, a gate to which a first enable signal is applied, and a drain;
   third and fourth first-type transistors each having a channel of a first conductivity type and having a source, a drain, and a gate, the source of the third first-type transistor coupled to the drain of the first first-type transistor, the source of the fourth first-type transistor coupled to the drain of the second first-type transistor, the gate of the third first-type transistor coupled to the drain of the fourth first-type transistor and the gate of the fourth first-type transistor coupled to the drain of the third first-type transistor; and
   first and second second-type transistors each having a channel of a second conductivity type and having a drain, a gate to which a second enable signal is applied, and a source coupled to a second voltage different from the first voltage, the drain of the first second-type transistor coupled to the drain of the third first-type transistor, the drain of the second second-type transistor coupled to the drain of the fourth first-type transistor.

4. The sense circuit of claim 3, further comprising a transformation circuit, wherein the transformation circuit is operable to couple the first data line to a node between the first first-type transistor and the third first-type transistor and further operable to couple the second data line to a node between the second first-type transistor and the fourth first-type transistor when in a first mode and/or in response to the first condition, and wherein the transformation circuit is operable to couple the first data line to a node between the third first-type transistor and the first second-type transistor and couple the first voltage to the source of the third first-type transistor, and further operable to couple the second data line to a node between the fourth first-type transistor and the second second-type transistor and couple the first voltage to the source of the fourth first-type transistor when in a second mode and/or in response to the second condition.

5. The sense circuit of claim 1 wherein the sensing circuit generates the second voltage differential between the first and second output nodes in the second mode in response to the first voltage differential generated in the first mode and the sensed difference between the current flow in the first data line and the current flow in the second data line.

6. A memory device, comprising:
   a plurality of memory cells;
   a data input/output (I/O) circuitry;
   a plurality of local data lines selectably couplable to respective ones of the memory cells;
   a plurality of global data lines coupled to the data I/O circuitry;
   a plurality of sense circuits, each sense circuit coupled to a respective pair of the global data lines and a respective pair of the local data lines, each sense circuit operable to sense a current differential between current flows in the respective local data lines to generate a voltage differential between the respective two global data lines; and
   a voltage sensing circuit associated with at least one of the sense circuits, the voltage sensing circuit operable to couple a first of the respective local data lines to a respective first of the global data lines and couple a second of the respective local data lines to a respective second of the global data lines after a corresponding one of the memory cells is accessed.

7. The memory device of claim 6 wherein the respective local and global data lines coupled to the at least one of the sense circuits are precharged to a first voltage before the one of the respective local digit lines is coupled to sense a respective one of the memory cells.

8. The memory device of claim 6 wherein at least one of the sense circuits further includes a transformation circuit and is transformable into a voltage sense amplifier by activating the transformation circuit in response to the memory device entering a particular mode.

9. The memory device of claim 6 wherein the voltage sensing circuit comprises a plurality of pairs of switches, and wherein each pair of the switches is associated with each of the sense circuits and operable to couple each of the respective local data lines to a respective one of the global data lines when activated.

10. The memory device of claim 6, further comprising at least one differential amplifier coupled to the two respective global data lines that are coupled to at least one of the sense circuits, the at least one differential amplifier operable to generate a signal indicative of the voltage differential between the respective voltage levels on the two respective global data lines.

11. An electronic device, comprising:
   a processor;
   a memory device coupled to the processor, the memory device comprising:
   a plurality of pairs of data lines;
   a plurality of sense circuits each having a pair of complementary nodes and coupled to a respective pair of data lines, at least one of the sense circuits operable to sense a voltage differential and a current differential between the respective pair of data lines, the at least one of the sense circuits further operable to generate a voltage differential on the complementary nodes indicative of the sensed voltage and current differentials.

12. The electronic device of claim 11 wherein at least one of the sense circuits is configured to be transformable from a current sense amplifier to a voltage sense amplifier.

13. The electronic device of claim 11 wherein at least one of the sense circuits is operable to sense the voltage differential between the respective data lines to generate an initial voltage differential between the respective complementary nodes before the at least one of the sense circuits begins sensing the current differential between the respective data lines.

14. The electronic device of claim 12 wherein the at least one of the sense circuits is transformed from a current sense amplifier to a voltage sense amplifier by using at least one of fuses, antifuses, metal lines and transistors.

15. The electronic device of claim 11 wherein at least one of the sense circuits is operable to sense a current differential between the respective data lines to generate a first voltage differential when in a first mode and/or in response to a first condition, and further operable to sense a voltage differential between the respective data lines to generate a second voltage differential when in a second mode and/or in response to a second condition.

16. A method of sensing data stored in a memory cell, comprising:

charging complementary data lines to a first voltage;

coupling one of the data lines to the memory cell to change a respective voltage level on the one of the data lines to a second voltage different from the first voltage;

coupling each of the data lines to a respective one of complementary nodes of a sense circuit to generate an initial voltage differential between the complementary nodes;

sensing a current differential between current flows in the data lines; and generating a resultant voltage differential between the complementary nodes at least partially in response to the initial voltage differential and the sensed current differential.

17. The method of claim 16, further comprising:

coupling the complementary nodes to respective inputs of a differential amplifier; and outputting from the differential amplifier a signal indicative of the data stored in the memory cell in response to the resultant voltage differential between the complementary nodes.

18. The method of claim 16, further comprising transforming the sense circuit into a voltage sense amplifier, a voltage differential is sensed between voltage levels on the data lines.

19. The method of claim 18 wherein the sense circuit is transformed into a voltage sense amplifier at least partially in response to entering a first mode and/or occurrence of a first condition and the sense circuit is transformed into a current sense amplifier at least partially in response to entering a second mode and/or occurrence of a second condition.

20. The method of claim 16 wherein charging complementary data lines to a first voltage comprises charging complementary data lines and complementary global data lines to the first voltage, wherein coupling each of the data lines to a respective one of complementary nodes of a sense circuit to generate an initial voltage differential between the complementary nodes comprises coupling each of the data lines to a respective one of the complementary global data lines to generate an initial voltage differential between the complementary global data lines, and wherein generating a resultant voltage differential between the complementary nodes at least partially in response to the initial voltage differential and the sensed current differential comprises generating a resultant voltage differential between the complementary global data lines at least partially in response to the initial voltage differential and the sensed current differential, the resultant voltage differential between the complementary global data lines indicative of the data stored in the memory cell.

* * * * *

UNITED STATES PATENT AND TRADEMARK OFFICE
CERTIFICATE OF CORRECTION

| | | |
|---|---|---|
| PATENT NO. | : 7,764,558 B2 | Page 1 of 1 |
| APPLICATION NO. | : 12/115687 | |
| DATED | : July 27, 2010 | |
| INVENTOR(S) | : Keiichiro Abe et al. | |

It is certified that error appears in the above-identified patent and that said Letters Patent is hereby corrected as shown below:

| Column, Line | Reads | Should Read |
|---|---|---|
| Front of Patent, Section (75) Inventors | "Yukata Ito" | --Yutaka Ito-- |

Signed and Sealed this
Seventh Day of June, 2011

David J. Kappos
*Director of the United States Patent and Trademark Office*